United States Patent
Kobatake

(10) Patent No.: US 8,149,640 B2
(45) Date of Patent: Apr. 3, 2012

(54) DIFFERENTIAL SENSE AMPLIFIER

(75) Inventor: Hiroyuki Kobatake, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 202 days.

(21) Appl. No.: 12/722,261

(22) Filed: Mar. 11, 2010

(65) Prior Publication Data
US 2010/0232243 A1   Sep. 16, 2010

(30) Foreign Application Priority Data

Mar. 12, 2009  (JP) ................................ 2009-059415

(51) Int. Cl.
*G11C 7/02* (2006.01)
(52) U.S. Cl. .................... 365/207; 365/185.21
(58) Field of Classification Search .................. 365/207, 365/185.21
See application file for complete search history.

(56) References Cited

U.S. PATENT DOCUMENTS
6,396,754 B1 * 5/2002 Lee et al. ...................... 365/201

FOREIGN PATENT DOCUMENTS
JP            1263997 A     10/1989
* cited by examiner

*Primary Examiner* — Son Dinh
*Assistant Examiner* — Nam Nguyen
(74) *Attorney, Agent, or Firm* — Sughrue Mion, PLLC

(57) ABSTRACT

The differential sense amplifier according to one aspect of the present invention includes a first differential amplification unit that detects a difference between the pair of complementary signals inputted from a first bit line and a second bit line, a second differential amplification unit that detects a difference between one of the complementary signals inputted from the first bit line and a first reference signal, and a third differential amplification unit that detects a difference between the other complementary signal inputted from the second bit line and a second reference signal.

9 Claims, 8 Drawing Sheets

DIFFERENTIAL SENSE AMPLIFIER

INCORPORATION BY REFERENCE

This application is based upon and claims the benefit of priority from Japanese patent application No. 2009-059415, filed on Mar. 12, 2009, the disclosure of which is incorporated herein in its entirety by reference.

BACKGROUND

1. Field of the Invention

The present invention relates to a differential sense amplifier, and particularly to a differential sense amplifier that detects a difference of a complementary bit line pair.

2. Description of Related Art

There is a semiconductor memory of a system in which complementary cells with complementary signals written therein are read by a differential sense amplifier in order to read data stored in a memory at high speed and stably (e.g., Japanese Patent Application No. 1-263997). A semiconductor memory shown in FIG. 11 includes a differential sense amplifier 10, a memory cell 11, and a decoder 12. Two pairs of complementary cells (a Bar cell M1B and a True cell M1T, a Bar cell M2B and a True cell M2T) are connected to one pair of complementary bit lines (a Bar bit line BLB, a True bit line BLT).

Upon receiving an address, the decoder 12 selects an arbitrary word line (WL1, WL2). The Bar bit line BLB and the True bit line BLT are connected to the differential sense amplifier 10. The differential sense amplifier 10 amplifies a potential difference of the complementary bit line pair made up of, for example, the Bar bit line BLB and the True bit line BLT.

Now, reading operation of the semiconductor memory shown in FIG. 11 is described. For example, assume that the M1B and the M2T are written cells (cells in an OFF state when selected), and the M1T and the M2B are unwritten cells (cells in an ON state when selected).

When the word line WL1 is selected, the Bar cell M1B enters an OFF state, resulting in a current IBLB flowing in the Bar bit line BLB=0. Moreover, the True cell M1T enters an ON state, resulting in a current IBLT flowing in the True bit line BLT=an ON current of the cell. In this case, the differential sense amplifier 10 detects a difference between the ON and OFF states of the cells, and outputs High from output (OUT).

On the other hand, when the word line WL2 is selected, the Bar cell M2B enters an ON state, and the True cell M2T enters an OFF state. In this case, the differential sense amplifier 10 detects a difference between the ON and OFF states of the cells, and outputs LOW from the output (OUT). In this manner, the complementary signals written in the cells are read differentially to thereby execute the reading operation at high speed and stably.

In the semiconductor memory of the reading system by the differential sense amplifier, data may be written after shipment. In this case, it is necessary to conduct blank check for confirming that data is not written in either of the True and Bar cells (in an erased state) before shipment.

SUMMARY

The present inventors have found the following problem. When both the True and Bar cells of the complementary cells are in the erased state, currents inputted to the differential sense amplifier 10 have a same value (IBLB=IBLT=an ON current of the cell). In this case, output of the differential sense amplifier 10 shown in FIG. 11 is inconstant. Thereby, the blank check to confirm that the data is not written in either of the True and Bar cells (both the cells are in the erased state) cannot be conducted, which poses a problem that shipment quality is largely reduced.

An exemplary aspect of the present invention is a differential sense amplifier includes a first differential amplification unit that detects a difference between the pair of complementary signals inputted from a first bit line and a second bit line, a second differential amplification unit that detects a difference between one of the complementary signals inputted from the first bit line and a first reference signal, and a third differential amplification unit that detects a difference between the other complementary signal inputted from the second bit line and a second reference signal.

Another exemplary aspect of the present invention is a differential sense amplifier includes a first current mirror circuit connected to a first bit line that transmits one of complementary signals, a second current mirror circuit connected to a second bit line that transmits the other complementary signal, the second current mirror circuit being connected to the first current mirror circuit symmetrically, a first transistor in which a source thereof is connected to a drain of a transistor making up the first current mirror circuit, a second transistor in which a source thereof is connected to a drain of a transistor making up the second current mirror circuit, a third transistor in which a first reference signal is inputted to a source and a gate thereof, a fourth transistor in which a second reference signal is inputted to a source and a gate thereof; and a switch circuit that switches between a state where the first transistor and the second transistor make up a current mirror, and a state where the first transistor and the third transistor make up a current mirror and at the same time, the second transistor and the fourth transistor make up a current mirror.

With the above-described configuration, whether or not the erased state is indicated can be checked for each of the pair of complementary signals.

According to the present invention, there can be provided a differential sense amplifier capable of checking whether or not a pair of complementary signals indicates an erased state, respectively, and a semiconductor memory using the same.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
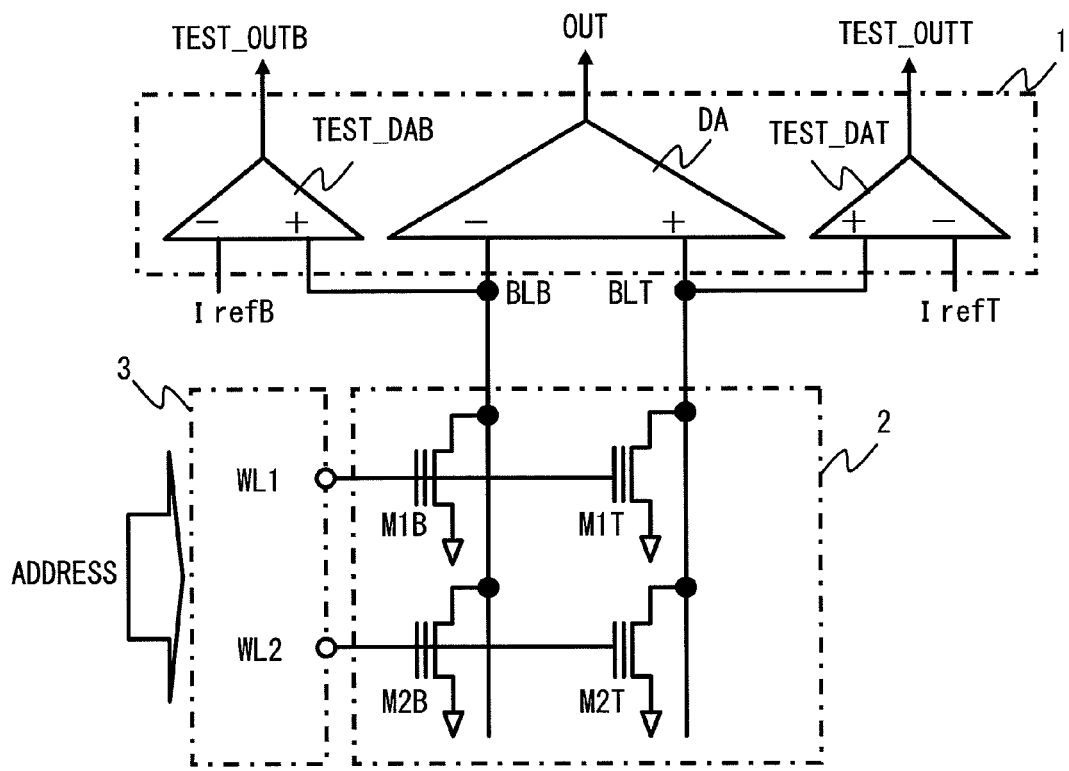
FIG. 1 is a diagram showing a configuration of a semiconductor memory according to a first exemplary embodiment.

Referring to FIG. 1, a configuration of a semiconductor memory using a differential sense amplifier according to a first exemplary embodiment of the present invention is described. FIG. 1 is a diagram showing the configuration of the semiconductor memory according to the present exemplary embodiment. As shown in FIG. 1, the semiconductor memory includes a differential sense amplifier 1, a memory cell 2, and a decoder 3.

The memory cell 2 has word lines (WL1, WL2), bit lines (a Bar bit line: BLB, a True bit line: BLT), and Bar cells (M1B, M2B), True cells (M1T, M2T). Here, for simplification of explanation, an example in which the two pairs of complementary cells (M1B and M1T, M2B and M2T) are connected to the one bit line pair (BLB, BLT) is described. For the memory cell 2 according to the present exemplary embodiment, a storage state is decided based on complementary signals stored in the complementary cells.

The word lines (WL1, WL2) are extended in a right and left direction in FIG. 1, and are arranged in parallel to each other. The bit lines (BLB, BLT) are extended in an up and down direction in FIG. 1, and are arranged in parallel to each other. The word lines (WL1, WL2) and the bit lines (BLB, BLT) are arranged so as to intersect one another.

At an intersection portion between the word line WL1 and the Bar bit line BLB, the Bar cell M1B is provided. At an intersection portion between the word line WL1 and the True bit line BLT, the True cell M1T is provided. At an intersection portion between the word line WL2 and the Bar bit line BLB, the Bar cell M2B is provided. At an intersection portion between the word line WL2 and the True bit line BLT, the True cell M2T is provided.

Upon receiving an address from the outside, the decoder 3 selects the arbitrary word line (WL1, WL2). The word line WL1 is connected to gates of the Bar cell M1B and the True cell M1T. Selecting the word line WL1 puts the Bar cell M1B and the True cell M1T into an ON state or an OFF state. The word line WL2 is connected to gates of the Bar cell M2B and the True cell M2T. Selecting the word line WL2 puts the Bar cell M2B and the True cell M2T into an ON state or an OFF state.

The differential sense amplifier 1 includes a differential amplifier for reading DA, differential amplifiers for blank check TEST_DAB, TEST_DAT. In the present exemplary embodiment, the Bar bit line BLB is connected to a negative input terminal of the differential amplifier for reading DA, and the True bit line BLT is connected to a positive input terminal thereof. The differential amplifier for reading DA detects a difference by the ON/OFF states of the respective memory cells to output a reading result from an output terminal OUT.

Figure 2:
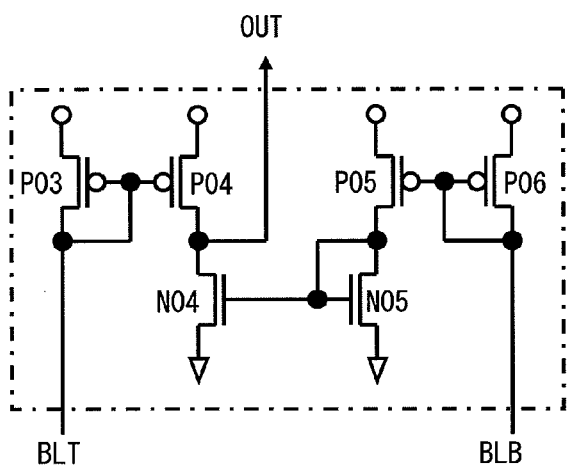
FIG. 2 is a diagram showing a configuration example of a differential amplifier used in the exemplary embodiment.
Figure 3:
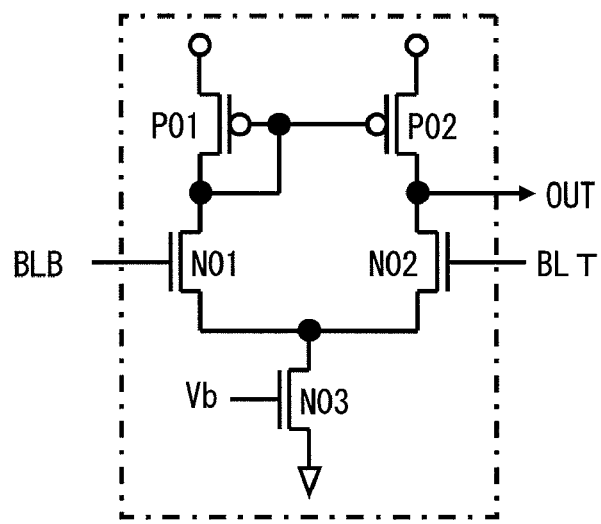
FIG. 3 is a diagram showing a configuration example of the differential amplifier used in the exemplary embodiment.

In FIGS. 2 and 3, examples of the differential amplifier used in the present exemplary embodiment are shown. The example shown in FIG. 2 is a current-comparison type differential amplifier including NMOSes (N04, N05), and PMOSes (P03, P04, P05, P06). The PMOSes (P03, P04), the PMOSes (P05, N06), and the NMOSes (N04, N05) make up current mirrors, respectively. The two pairs of current mirrors (P03, P04) and (P05, P06) are respectively connected to the bit lines BLB, BLT, to which a pair of complementary signals is transmitted.

Particularly, to a source and a gate of the PMOS (P03) is connected the True bit line BLT. To the gate of the PMOS (P03) is connected a gate of the PMOS (P04). To a drain of the PMOS (P04) is connected a source of the NMOS (N04). A connection point between the PMOS (P04) and the NMOS (N04) is connected to the output terminal OUT.

Moreover, to a source and a gate of the PMOS (P06) is connected the Bar bit line BLB. To the gate of the PMOS (P06) is connected a gate of the PMOS (P05). To a drain of the PMOS (P05) are connected a source and a gate of the NMOS (N05). A gate of the NMOS (N04) is connected to the gate of the NMOS (N05).

The example shown in FIG. 3 is a voltage-comparison type differential sense amplifier made up of NMOSes (N01, N02, N03), and PMOSes (P01, P02). In such a voltage-comparison type differential sense amplifier, load elements are connected to the Bar bit line BLB and the True bit line BLT respectively to convert cell currents to voltages for use.

Particularly, the PMOSes (P01, P02) make up a current mirror, and the NMOSes (N01, N02) make up a differential pair. To a gate of the NMOS (N01) is connected the Bar bit line BLB, and to a gate of the NMOS (N02) is connected the True bit line BLT. To respective drains of the NMOSes (N01, N02) is connected a source of the NMOS (N03).

To a source of the NMOS (N01) are connected a drain and a gate of the PMOS (P01). To a source of the NMOS (N02) is connected a drain of the PMOS (P02). To a gate of the PMOS (P02) is connected the gate of the PMOS (P01). To a connection point between the PMOS (P02) and the NMOS (N02) is connected the output terminal OUT.

Figure 4:
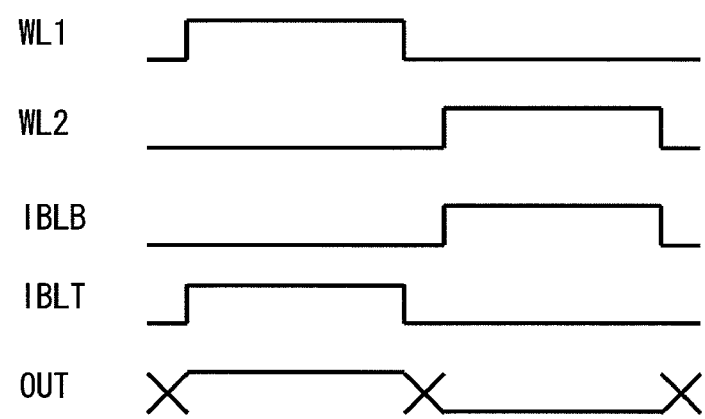
FIG. 4 is a timing chart for explaining operation of the semiconductor memory according to the first exemplary embodiment.

Now, referring to FIG. 4, a description of reading operation is given. For example, assume that the Bar cell M1B and the True cell M2T are written cells (cells in an OFF state when selected), and the Bar cell M2B, and the True cell M1T are unwritten cells (cells in an ON state when selected). When the Bar cell M1B is in the OFF state, the current IBLB flowing in the bit line BLB=0. When the True cell M1T is in the ON state, the current IBLT flowing in the bit lint BLT=an ON current of the cell.

When the word line WL1 is selected, the Bar cell M1B is turned OFF, and the True cell M1T is turned ON. The differential amplifier for reading DA compares the inputted IBLB and IBLT to output High from the output terminal OUT. On the other hand, when the word line WL2 is selected, the Bar cell M2B is turned ON and the True cell M2T is turned OFF.

The differential amplifier for reading DA compares the inputted IBLB and IBLT to output Low from the output terminal OUT.

When data needs to be written, after shipment, in the programmable semiconductor memory of the reading system by the above-described differential sense amplifier (e.g., Flash or the like), it is necessary to conduct the blank check to confirm that data is written in neither of the True and Bar complementary cells (in erased state). For this, in the present exemplary embodiment, the differential amplifiers for blank check TEST_DAB, TEST_DAT are provided.

The differential amplifiers for blank check TEST_DAB, TEST_DAT determine whether the complementary cells are in a written state or in an unwritten state. Here, the Bar bit line BLB is connected to a positive input terminal of the differential amplifier for blank check TEST_DAB, and a reference current IrefB is connected to a negative input terminal. The differential amplifier for blank check TEST_DAB outputs a comparison result between the IBLB and the IrefB to a TEST_OUTB.

The True bit line BLT is connected to a positive input terminal of the differential amplifier for blank check TEST_DAT, and a reference current IrefT is connected to a negative input terminal thereof. The differential amplifier for blank check TEST_DAT outputs a comparison result between the IBLT and the IrefT to a TEST_OUTT.

Figure 5:
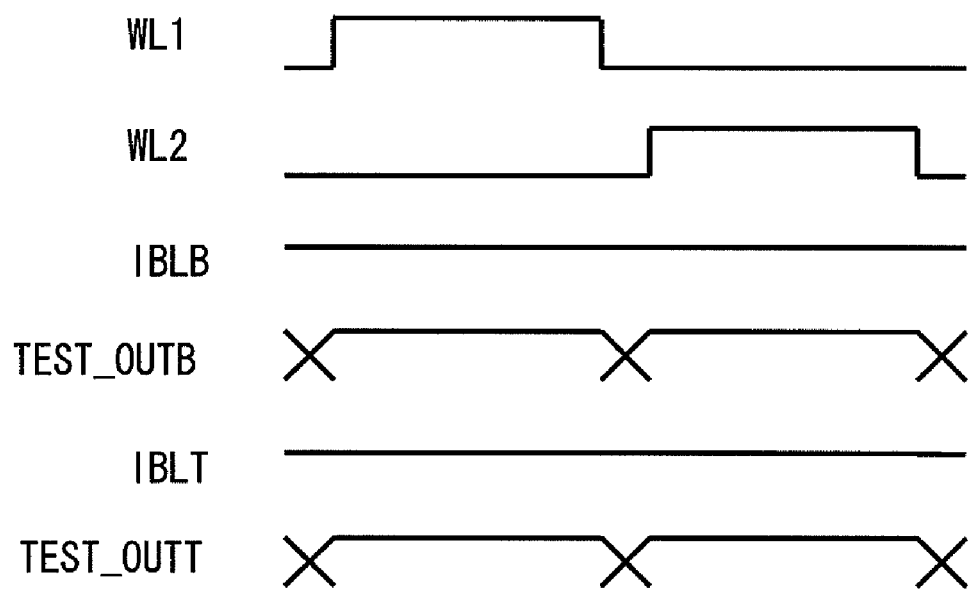
FIG. 5 is a timing chart for explaining operation of the semiconductor memory according to the first exemplary embodiment.

Now, referring to FIG. 5, a description of blank check operation is given. When both the True and Bar cells are in an unwritten state (IBLB=IBLT=the ON current of the cell), the memory cells of interest are determined to be blank.

An example in which the IrefB and the IrefT are set to values not larger than the ON current of the cell and larger than the cell current of the written cell (approximately 0) is described. When both the True and Bar cells connected to the Bar bit line BLB and the True bit line BLT are in the unwritten state, as to the currents flowing in the Bar bit line BLB and the True bit line BLT, IBLB=IBLT=the ON current of the cell. In this case, IBLB is larger than the IrefB. Moreover, the IBLT is larger than the IrefT. Accordingly, High is outputted from the TEST_OUTB and the TEST_OUTT, respectively.

In this manner, by checking that the TEST_OUTB and the TEST_OUTT are both High, both the True and Bar cells are determined to be in the unwritten state (blank state).

On the other hand, when either of the True and Bar cells is in the written state, the current flowing in the bit line connected to the cell in the written state is 0. Moreover, when both the True and Bar cells are in the written state, the IBLB and the IBLT are both 0. Accordingly, when Low is outputted from either the TEST_OUTB or the TEST_OUTT, it is determined that not both the True and Bar cells are in the unwritten state (blank).

As described above, according to the present exemplary embodiment, the differential sense amplifier capable of conducting the black check can be realized to increase the quality of the semiconductor memory. While the reference currents IrefB and IrefT are described using different denotation, the same reference current may be set for the IrefB and the IrefT. In this manner, a configuration using only one reference current can be also employed.

Moreover, while in the above-described exemplary embodiment, the electrically writable nonvolatile memory cell such as a Flash is described, the present invention is not limited to this. A similar effect can be obtained with a similar configuration using an electrically writable Fuse element. Also, a UV-EPROM or a one-time PROM may be employed.

Second Exemplary Embodiment

Figure 6:
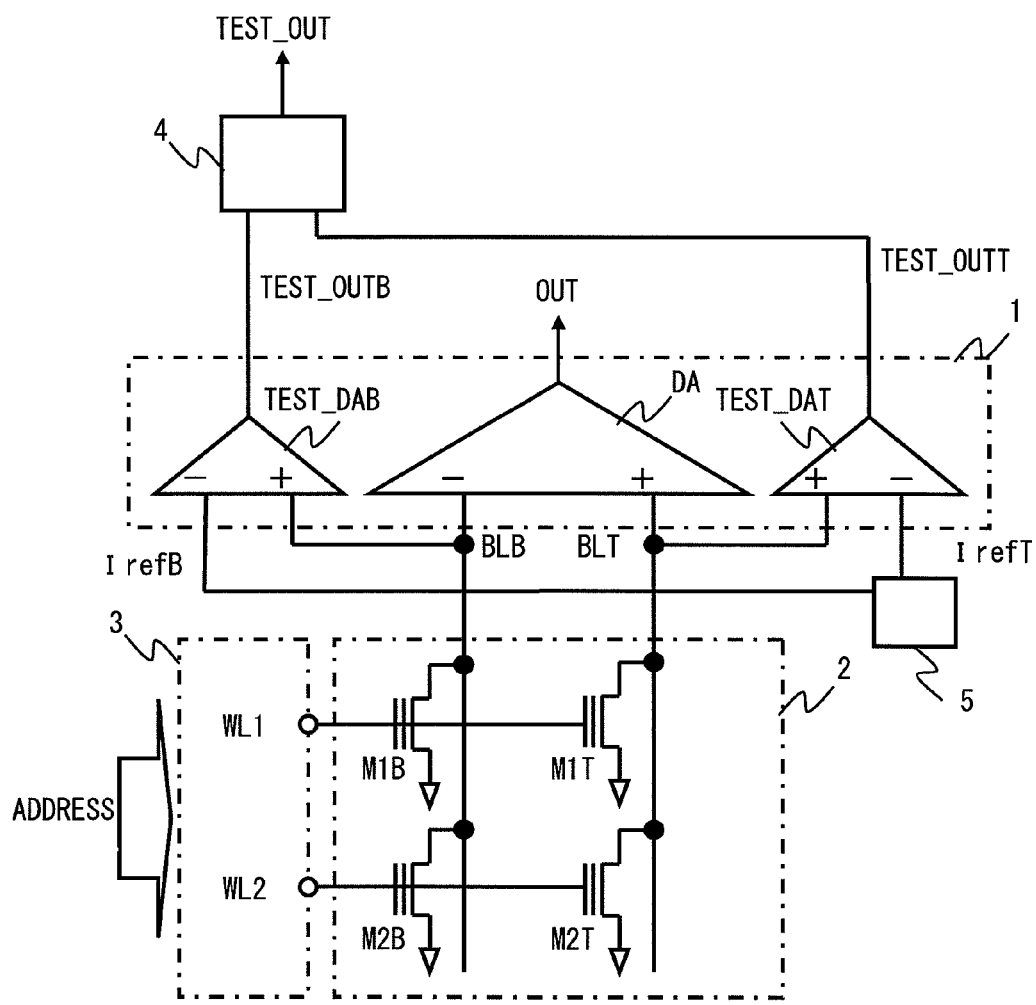
FIG. 6 is a diagram showing a configuration of a semiconductor memory according to a second exemplary embodiment.

Referring to FIG. 6, a semiconductor memory according to a second exemplary embodiment of the present invention is described. FIG. 6 is a diagram showing a configuration of the semiconductor memory according to the present exemplary embodiment. In FIG. 6, the same reference numerals are given to similar components to those in FIG. 1, and descriptions thereof are omitted. As shown in FIG. 6, in the present exemplary embodiment, a determination circuit 4 is provided that confirms the erased state of both the True and Bar cells, based on output signals from the differential amplifiers for blank check TEST_DAB, TEST_DAT described in the first exemplary embodiment.

As the determination circuit 4, for example, means for performing AND operation of the output signals from the differential amplifiers for blank check TEST_DAB, TEST_DAT or means for performing OR operation thereof can be used. In the following description, as the determination circuit 4, an example using an AND circuit is described.

Figure 7:
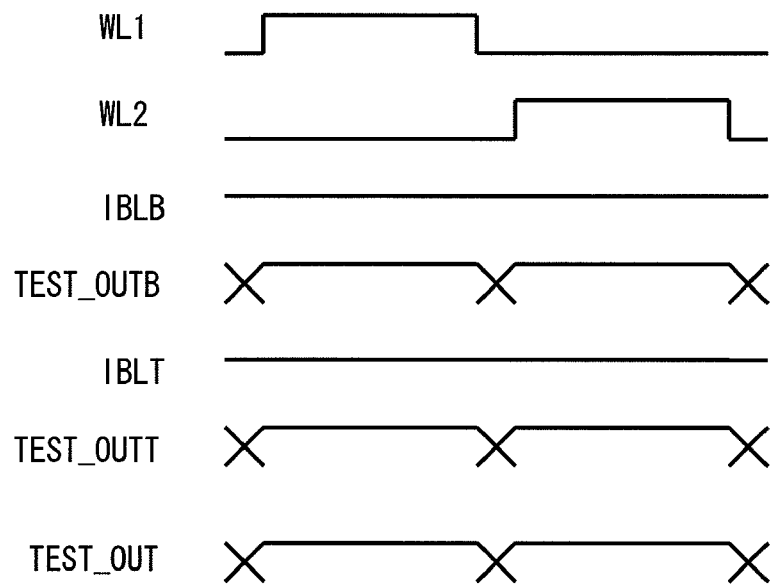
FIG. 7 is a timing chart for explaining operation of the semiconductor memory according to the second exemplary embodiment.

Referring to FIG. 7, operation of the blank check is described. When both the True and Bar cells are in the erased state, High is outputted from the TEST_OUTB and the TEST_OUTT, respectively. This operation is the same as the operation described in the first exemplary embodiment, and thus, is omitted.

When High is inputted from the TEST_OUTB and the TEST_OUTT, respectively, the determination circuit 4 determines whether or not both the True and Bar cells are in the erased state. In the present example, since the output signals inputted from the TEST_OUTB and the TEST_OUTT are both High, the determination circuit 4 outputs High. Thereby, it can be determined that both the True and Bar cells are in the erased state (blank state).

When either of the True and Bar cells is in the written state, Low is outputted from the TEST_OUTB or the TEST_OUTT of the cell in the written state. Moreover, when both the True and Bar cells are in the written state, Low is outputted from the TEST_OUTB and the TEST_OUTT. In this case, Low is outputted from a TEST_OUT of the determination circuit 4. In this case, Low is outputted from the TEST_OUT of the determination circuit 4. Thereby, it is detected that neither of the True and Bar cells are in the erased state (blank state). Thus, according to the present exemplary embodiment, the blank check can be executed by the one terminal (TEST_OUT), which can reduce terminals for test in number.

While the case of positive logic has been described in the foregoing, in the case of negative logic, a circuit that performs OR operation of the output signals from the differential amplifiers for blank check TEST_DAB, TEST_DAT can be used to similarly determine the erased state of the complementary cells.

Moreover, in the present exemplary embodiment, a reference-current generating circuit 5 that controls the reference currents IrefB, IrefT is provided. In order to secure an operation margin, which is an enough current difference to be surely read by the differential amplifier for reading DA, the reference currents IrefB, IrefT are set to predetermined values by the reference-current generating circuit 5.

Figure 8:
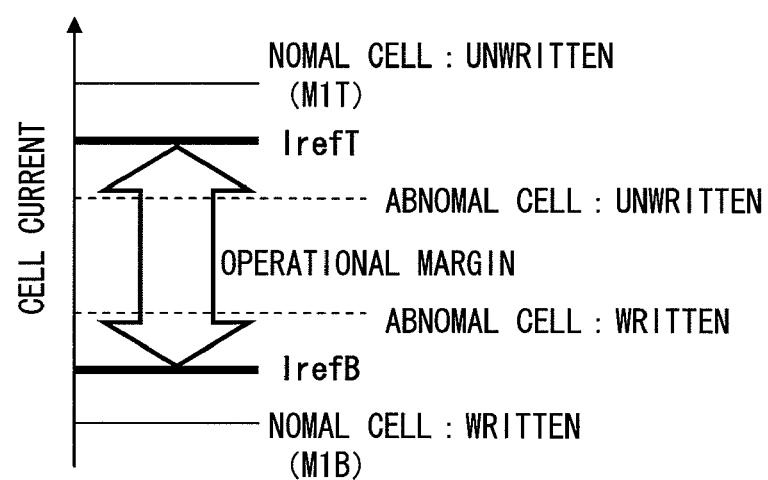
FIG. 8 is a diagram for explaining a setting method of reference currents in a semiconductor memory according to a second exemplary embodiment.

Hereinafter, referring to FIG. 8, a setting method of the reference currents IrefB, IrefT is described. For example, a case where the True cell M1T is an unwritten cell and the Bar cell M1B is a written cell is described. As shown in FIG. 8, the reference current IrefT is set to a value smaller than a normal unwritten cell current. Moreover, the reference current IrefB is set to a value larger than the normal unwritten cell current. Furthermore, a difference between the IrefT and the IrefB is set to be larger than a minimum detection current difference of the differential amplifier.

Thereby, an abnormal cell (unwritten cell) having a cell current not higher than the IrefT and an abnormal cell (written cell) having a cell current not lower than the IrefB can be detected to reject the semiconductor memory in which the abnormal cell can be detected. This can ensure more stable operation while securing the operation margin of the differential amplifier.

While in the foregoing, the case of the differential amplifier that compares the cell currents has been described, in the case of the differential amplifier in which the cell currents are caused to flow in the load elements to be converted into voltages as shown in FIG. 3, reference voltages can also be decided similarly.

Third Exemplary Embodiment

Figure 9A:
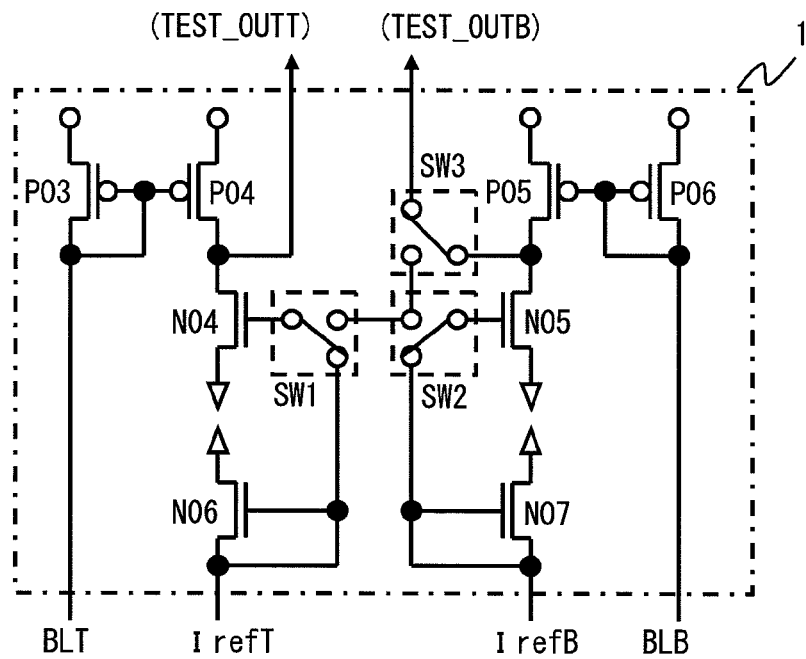
FIG. 9A is a diagram showing a configuration of a differential sense amplifier according to a third exemplary embodiment.
Figure 9B:
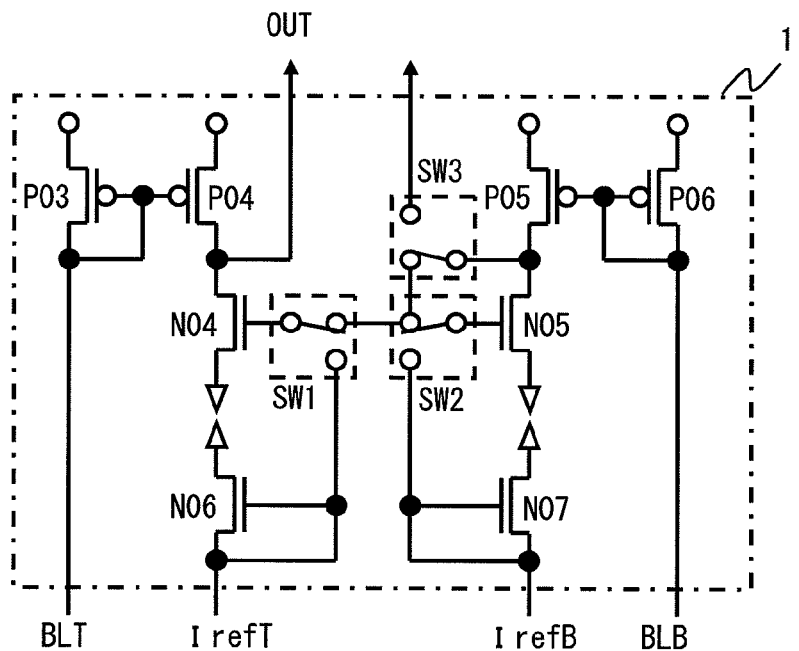
FIG. 9B is a diagram showing a configuration of a differential sense amplifier according to a third exemplary embodiment.

Referring to FIGS. 9A, 9B, a differential sense amplifier according to a third exemplary embodiment of the present invention is described. FIGS. 9A, 9B are diagrams showing one example of a configuration of the differential sense amplifier 1 according to the present exemplary embodiment. As shown in FIGS. 9A, 9B, the differential sense amplifier 1 according to the present exemplary embodiment includes three switches (SW1, SW2, SW3) and two NMOSes (N06, N07) in addition to the configuration of the current-comparison type differential amplifier shown in FIG. 2.

Controlling the switches (SW1, SW2, SW3) allows the NMOS (N06) and the NMOS (N04) to make up a current mirror, and the NMOS (N07) and the NMOS (M05) to make up a current mirror.

A first current mirror made up of the PMOSes (P03, P04) is connected to the Bar bit line BLB, which transmits one of the complementary signals. A second current mirror made up of the PMOSes (P05, P06) is connected to the True bit line BLT, which transmits the other complementary signal. The first current mirror and the second current mirror are formed symmetrically.

The source of the NMOS (N04) is connected to the drain of the PMOS (P04) making up the first current mirror. A source of the NMOS (N05) is connected to the drain of the PMOS (P05) making up the second current mirror.

The reference current IrefT is connected to a source and a gate of the NMOS (N06). The switch SW1 is provided between the gate of the NMOS (N04) and the gate and the source of the NMOS (N6). The reference current IrefB is inputted to a source and a gate of the NMOS (N07). The switch SW2 is provided between the gate of the NMOS (N05) and the gate and the source of the NMOS (N07). The switch SW3 is provided between a connection point between the PMOS (P05) and the NMOS (N05), and the output TEST_OUTB.

The switches SW1, SW2, SW3 are switch circuits that switch between a state where the NMOSes (N04, N06) make up a current mirror and at the same time, the NMOSes (N05, N07) make up a current mirror as shown in FIG. 9A, and a state where the NMOSes (N04, N05) make up a current mirror as shown in FIG. 9B.

Setting the switches (SW1, SW2, SW3) to the state shown in FIG. 9A allows the differential sense amplifier 1 to be used as the differential amplifier for blank check. On the other hand, setting the switches (SW1, SW2, SW3) to the state shown in FIG. 9B allows the differential sense amplifier 1 to be used as the differential amplifier for reading.

In this manner, in the present exemplary embodiment, by adding the three switches (SW1, SW2, SW3) and the two NMOSes (N06, N07) to the differential amplifier shown in FIG. 2, the differential sense amplifier capable of the blank check can be configured, which suppresses an increase in area by addition of the blank check function.

Fourth Exemplary Embodiment

Figure 10A:
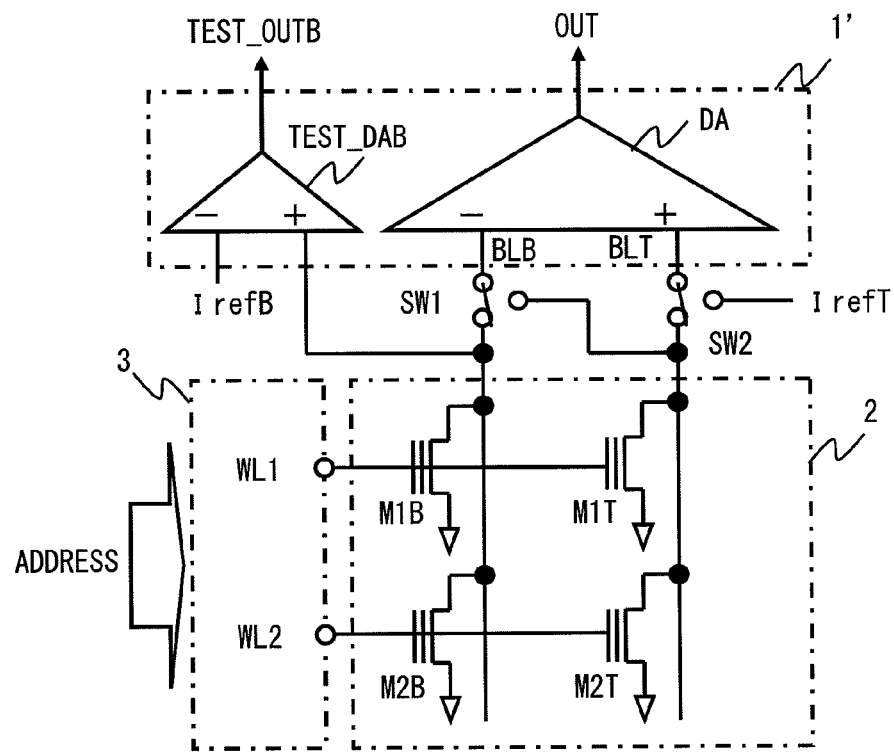
FIG. 10A is a diagram showing a configuration of a semiconductor memory according to a fourth exemplary embodiment.
Figure 10B:
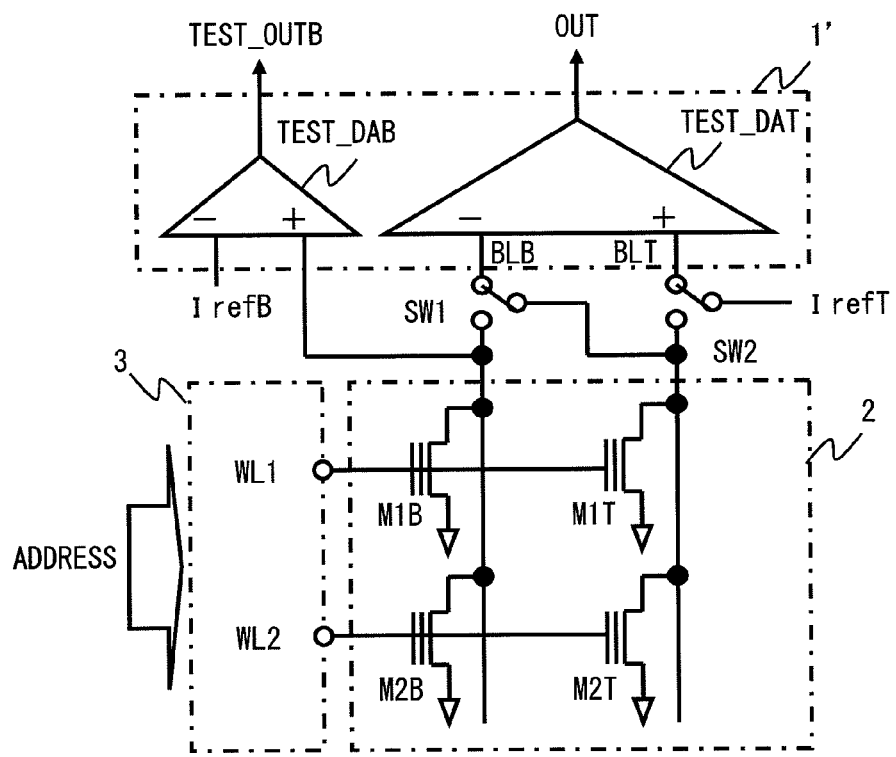
FIG. 10B is a diagram showing a configuration of a semiconductor memory according to a fourth exemplary embodiment.
Figure 11:
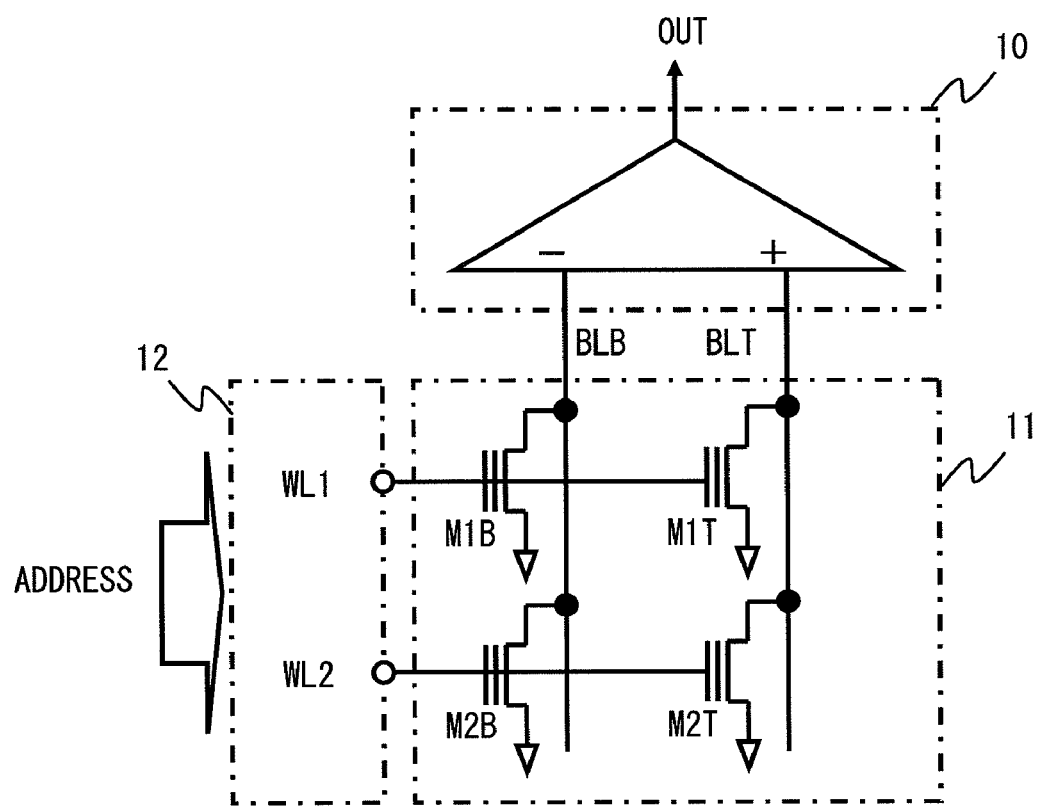
FIG. 11 is a diagram showing a configuration of a semiconductor memory in the related art.

Referring to FIGS. 10A, 10B, a configuration of a semiconductor memory according to a fourth exemplary embodiment of the present invention is described. FIGS. 10A, 10B are diagrams showing the configuration of the semiconductor memory according to the present exemplary embodiment. As shown in FIGS. 10A, 10B, in the present exemplary embodiment, a differential sense amplifier 1' made up of two differential amplifiers, and the switches SW1, SW2 are provided.

One of the differential amplifiers making up the differential sense amplifier 1' is the differential amplifier for blank check TEST_DAB. The Bar bit line BLB is connected to the positive input terminal of the differential amplifier for blank check TEST_DAB, and the reference current IrefB is inputted to the negative input terminal thereof.

The other differential amplifier is switched by switchover of the switches SW1, SW2 to the differential amplifier for reading DA or the differential amplifier for blank check TEST_DAT. The switch SW1 connects either of the Bar bit line BLB and the True bit line BLT to the negative input terminal. The switch SW2 connects either of the True bit line BLT and the reference current IrefT to the positive input terminal.

As shown in FIG. 10A, by setting so as to cause the switch SW1 to connect the Bar bit line BLB to the negative input terminal and to cause the switch SW2 to connect the True bit line BLT to the positive input terminal, the differential sense amplifier 1' is used as the differential amplifier for reading DA. As shown in FIG. 10B, by setting so as to cause the switch SW1 to connect the True bit line BLT to the negative input terminal and to cause the switch SW2 to connect the reference current IrefT to the positive input terminal, the differential sense amplifier 1' is used as the differential amplifier for blank check TEST_DAT. This can suppress an increase in area.

The present invention is not limited by the above-described exemplary embodiments, but modifications can be made within a range not departing from the gist. For example, the reference current generating circuit 5 that controls the reference currents IrefB, IrefT may be provided in the semiconductor memory described in the first exemplary embodiment. Moreover, switching the input of the differential amplifier can realize the differential amplifier for reading, the differential amplifier for blank check of the Bar cells and the differential amplifier for blank check of the True cells with one differential amplifier.

The first to fourth exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A differential sense amplifier comprising:
   a first differential amplification unit that detects a difference between a pair of complementary signals inputted from a first bit line and a second bit line;

a second differential amplification unit that detects a difference between one of the complementary signals inputted from the first bit line and a first reference signal; and a third differential amplification unit that detects a difference between the other complementary signal inputted from the second bit line and a second reference signal.

2. The differential sense amplifier according to claim 1, wherein the first differential amplification unit and the second differential amplification unit are made of one differential amplifier, and the differential sense amplifier comprises a switch circuit that switches between a state where the first bit line and the second bit line are connected to input of the differential amplifier and a state where the first bit line and a first reference signal line that transmits the first reference signal are connected.

3. The differential sense amplifier according to claim 1, wherein the first differential amplification unit and the second differential amplification unit, and the first differential amplification unit and the third differential amplification unit share at least one transistor, respectively.

4. A differential sense amplifier comprising:

a first current mirror circuit connected to a first bit line that transmits one of complementary signals;

a second current mirror circuit connected to a second bit line that transmits the other complementary signal;

a first-conductivity-type first transistor in which a source thereof is connected to a drain of a second-conductivity-type transistor making up the first current mirror circuit;

a first-conductivity-type second transistor in which a source thereof is connected to a drain of a second-conductivity-type transistor making up the second current mirror circuit;

a first-conductivity-type third transistor in which a first reference signal is inputted to a source and a gate thereof;

a first-conductivity-type fourth transistor in which a second reference signal is inputted to a source and a gate thereof; and a switch circuit that switches between a state where the first transistor and the second transistor make up a current mirror, and a state where the first transistor and the third transistor make up a current mirror and at the same time, the second transistor and the fourth transistor make up a current mirror.

5. The differential sense amplifier according to claim 1, wherein the first reference signal and the second referential signal have substantially equal current or voltage levels to each other.

6. A semiconductor memory comprising:

the differential sense amplifier according to claim 1;

a first memory cell that is connected to the first bit line, the first memory cell storing one of the complementary signals; and a second memory cell that is connected to the second bit line, the second memory cell storing the other complementary signal.

7. The semiconductor memory according to claim 6, wherein the first memory cell and the second memory cell are each made of any one of a nonvolatile memory cell, a fuse element and a one-time PROM.

8. The semiconductor memory according to claim 6, further comprising a determination circuit that determines whether the first memory cell and the second memory cell are in an unwritten state or not, based on an output signal of the second differential amplification unit and an output signal of the third amplification unit.

9. The semiconductor memory according to claim 6, further comprising a reference-signal generating circuit that controls the first reference signal and the second reference signal.

* * * * *